(12) United States Patent
Carpenter et al.

(10) Patent No.: US 7,596,849 B1
(45) Date of Patent: Oct. 6, 2009

(54) METHOD OF ASSEMBLING A WAFER-LEVEL PACKAGE FILTER

(75) Inventors: Charles Carpenter, Orlando, FL (US); George Grama, Sanford, FL (US); Kevin K. Lin, Fremont, CA (US)

(73) Assignee: Triquint Semiconductor, Inc., Orlando, FL (US)

( * ) Notice: Subject to any disclaimer, the term of this patent is extended or adjusted under 35 U.S.C. 154(b) by 116 days.

(21) Appl. No.: 11/623,884

(22) Filed: Jan. 17, 2007

Related U.S. Application Data

(60) Continuation-in-part of application No. 11/461,587, filed on Aug. 1, 2006, which is a division of application No. 10/867,172, filed on Jun. 14, 2004, now Pat. No. 7,109,635.

(60) Provisional application No. 60/759,900, filed on Jan. 18, 2006, provisional application No. 60/477,576, filed on Jun. 11, 2003.

(51) Int. Cl.
H01S 4/00 (2006.01)
(52) U.S. Cl. .......................... 29/592.1; 29/729; 29/739; 29/758; 29/764; 29/876; 310/348; 310/340; 310/344; 439/133; 439/306; 439/307; 439/546; 439/578
(58) Field of Classification Search ............... 29/592.1, 29/729, 739, 758, 764, 876; 310/313, 340, 310/344, 348; 439/133, 306, 307, 546–548, 439/578
See application file for complete search history.

(56) References Cited

U.S. PATENT DOCUMENTS

| 4,578,853 | A | * | 4/1986 | Wurth | 29/598 |
| 5,859,486 | A | * | 1/1999 | Nakahara et al. | 310/254 |
| 5,894,654 | A | * | 4/1999 | Varis et al. | 29/598 |
| 6,323,571 | B1 | * | 11/2001 | Nakahara et al. | 310/71 |

* cited by examiner

*Primary Examiner*—Paul D Kim
(74) *Attorney, Agent, or Firm*—Allen, Dyer, Doppelt, Milbrath & Gilchrist, P.A.

(57) ABSTRACT

A wafer level package filter includes a device wafer having an acoustic wave device disposed on its surface, the acoustic wave device including at least an acoustic wave resonator associated with a piezoelectric substrate and a connecting pad. A capped substrate includes circuitry having inductors and capacitors. The capped substrate has a coefficient of thermal expansion significantly unequal to a coefficient of thermal expansion for the piezoelectric substrate. An adhesive bond connects the capped substrate to the device wafer for encapsulating the acoustic wave device within a cavity. A dielectric overcoat is deposited over a portion of the capped substrate, and a metallization layer extends over a portion of the dielectric layer connecting the capped substrate circuitry to a connecting pad of the acoustic wave device. Optionally, a bond connecting the capped substrate to the device wafer may provide an interlocking connection.

29 Claims, 3 Drawing Sheets

METHOD OF ASSEMBLING A WAFER-LEVEL PACKAGE FILTER

CROSS-REFERENCE TO RELATED APPLICATIONS

This application is a Continuation-In-Part application of application Ser. No. 11/461,587 filed Aug. 1, 2006, now pending for "Wafer Level Packaging of Materials with Different Coefficients of Thermal Expansion," which itself is a Divisional application of application Ser. No. 10/867,172 having filing date Jun. 14, 2004 and issuing as U.S. Pat. No. 7,109,635 which itself claims the benefit of provisional patent application Ser. No. 60/477,576 filed on Jun. 11, 2003, and further claims the benefit of U.S. Provisional Application No. 60/759,900 for "Wafer-Level SAW/BAW Package with Integrated Capping Circuit" having filing date of Jan. 18, 2006, the disclosures of which are hereby incorporated by reference herein in their entirety, and all commonly owned.

FIELD OF INVENTION

The present invention generally relates to bulk acoustic wave (BAW) and surface acoustic wave (SAW) filters useful for applications in wireless communications.

BACKGROUND

As the handset filter market continues to push for reductions in size and cost, SAW/BAW manufacturers are incorporating wafer-level packaging (WLP) solutions to meet these goals. SAW/BAW filters require an air cavity over their active area for proper acoustic performance. While many WLP solutions exist for forming these cavities within very small packages by capping the active areas at wafer-level, few suppliers are addressing the need to provide increased levels of functionality into the same small package footprint and height. For example, the matching of a packaged SAW/BAW filter to a specific impedance typically involves the use of an LC circuit composed of surface mount technology (SMT) inductors and capacitors placed on a substrate external to the filter package itself. In this case, the reduction in footprint achieved by the wafer-level packaged filter is overshadowed by the increase in overall board space required for the LC matching circuit. The ability to integrate this matching circuit directly into the WLP package would allow the customer to attain a substantial reduction in board space and an overall reduction in their BOM. In addition, the relatively short interconnections achieved with an integrated WLP solution can improve RF performance by reducing loss. U.S. Pat. No. 7,042,056 to Koshido discloses several embodiments of a WLP filter with integrated matching circuitry. However, all the embodiments as disclosed by Koshido require a fabrication of through-holes. It is highly desirable to have a robust WLP filter with integrated circuitry which can withstand the high pressures and temperatures associated with the molding of WLP filters into modules.

SUMMARY

Embodiments of the present invention provide desirable low cost, miniature, wafer-level packaged, acoustic filters that allow for increased functionality through an incorporation of additional circuitry within the package, when compared to embodiments well known in the art.

A wafer level package filter in keeping with the teachings of the present invention, may comprise a device wafer having an acoustic wave device disposed on a surface thereof, the acoustic wave device including at least an acoustic wave resonator associated with a piezoelectric substrate and a connecting pad, a capped substrate having a circuitry consisting of at least one of an inductor and a capacitor, the capped substrate having a coefficient of thermal expansion significantly unequal to a coefficient of thermal expansion for the piezoelectric substrate associated with a forming of the acoustic resonator, an adhesive bond connecting the capped substrate to the device wafer for encapsulating the acoustic wave device within a cavity formed between the acoustic resonator and the capped substrate, a dielectric overcoat deposited at least over a portion of the capped substrate, and a metallization layer extending over at least a portion of the dielectric layer connecting the capped substrate circuitry to a connecting pad of the acoustic wave device.

Optional, an embodiment may comprise a bond connecting the capped substrate to the device wafer for encapsulating the acoustic wave device, wherein the bond include first and second bond portions extending from opposing surfaces of the capped substrate and the piezoelectric device wafer, respectively, for providing an interlocking connection therebetween.

A method aspect of the invention is directed to assembling a wafer-level package filter, which method may comprise constructing a capping circuit on a capping substrate, providing a carrier wafer and a device wafer having compatible coefficients of thermal expansion such that a thermal mismatch is prevented during elevated temperatures of a wafer bonding process, forming a device metalization layer on a surface of the device wafer, wherein the device metalization includes an active die filter area, applying an adhesive seal on the device metalization layer for placing the active die filter area within a cavity, removably attaching the capping substrate to a surface of the carrier substrate, bonding the carrier wafer to the device wafer by attaching the capping substrate having the capping circuit thereon to the adhesive seal for securing the capping structure to the device wafer having the device metalization thereon, releasing the capping substrate and device wafer from the carrier wafer, applying a dielectric layer over the capping substrate while maintaining exposure to the capping circuit, and applying an I/O metallization layer for joining an I/O connection of the capping circuit with an I/O connection of the device wafer and thus electronically connecting the capping circuit to the device circuit.

The method may further comprise applying a second dielectric layer over the capping substrate for protecting exposed capping circuitry while defining contacts for electrical connection to a printed circuit board in a solder flip chip attachment, further optionally applying solder bumps to selected I/O connections on the cap substrate.

BRIEF DESCRIPTION OF DRAWINGS

For a fuller understanding of the invention, reference is made to the following detailed description, taken in connection with the accompanying drawings illustrating embodiments of the present invention, in which.

DETAILED DESCRIPTION OF EMBODIMENTS

The present invention will now be described more fully with reference to the accompanying drawing in which an embodiment of the invention is shown and described. It is to be understood that the invention may be embodied in many different forms and should not be construed as limited to the illustrated embodiment set forth herein. Rather, this embodiment is provided so that this disclosure may be thorough and complete, and will convey the scope of the invention to those skilled in the art.

Figure 1A:
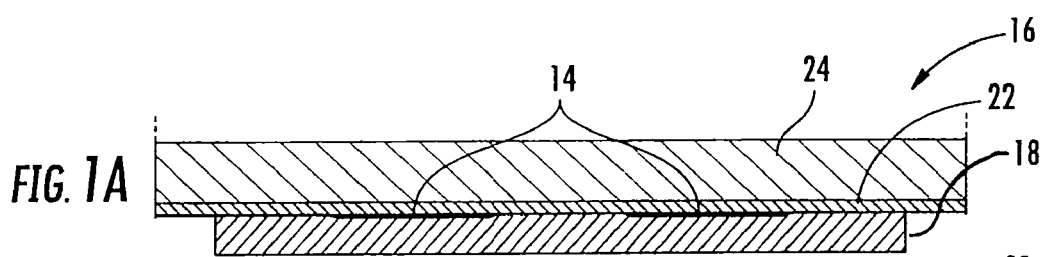
FIGS. 1A-1G illustrate a sequence for constructing a wafer-level SAW/BAW package having an integrated capping circuit in keeping with the teachings of the present invention.
Figure 1B:
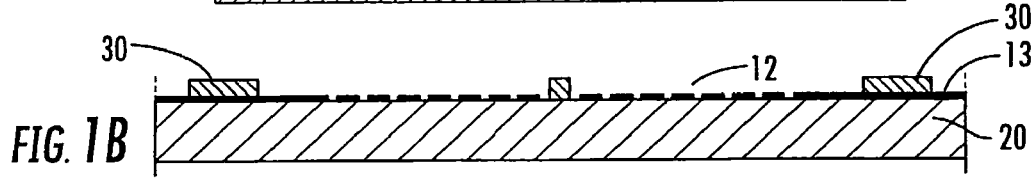
Figure 1C:
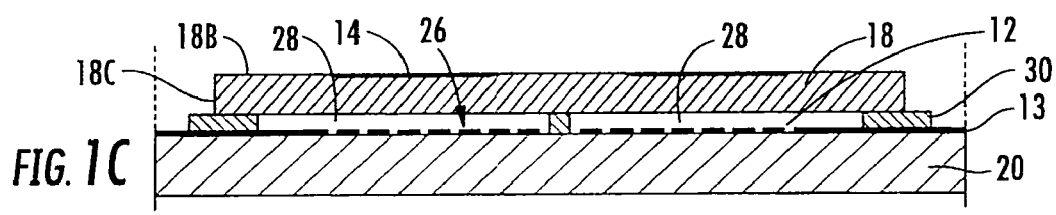
Figure 1D:
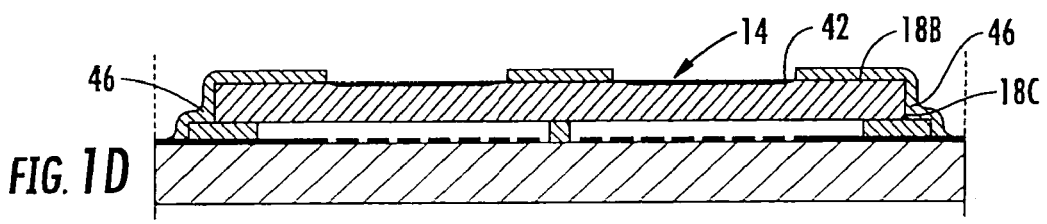
Figure 1E:
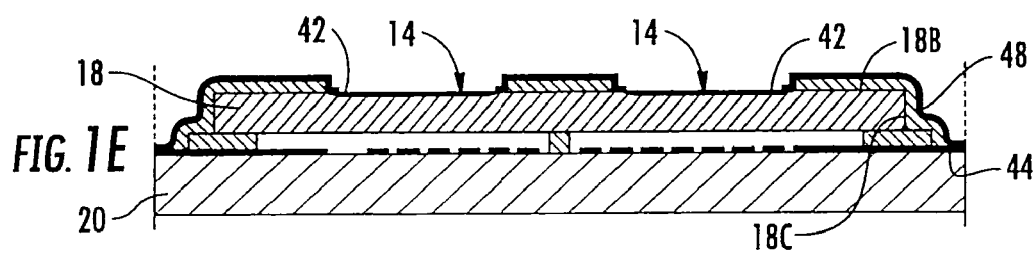
Figure 1F:
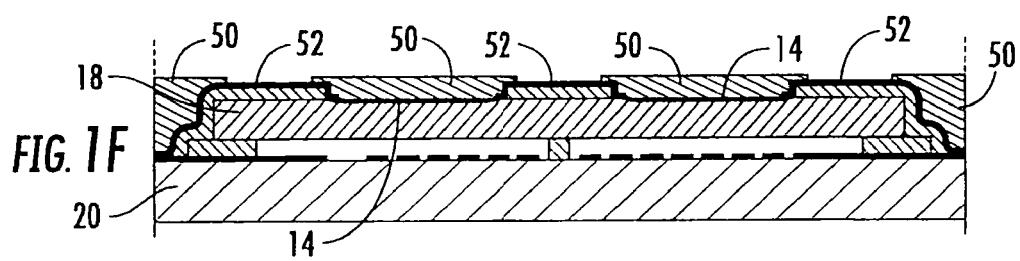
Figure 1G:
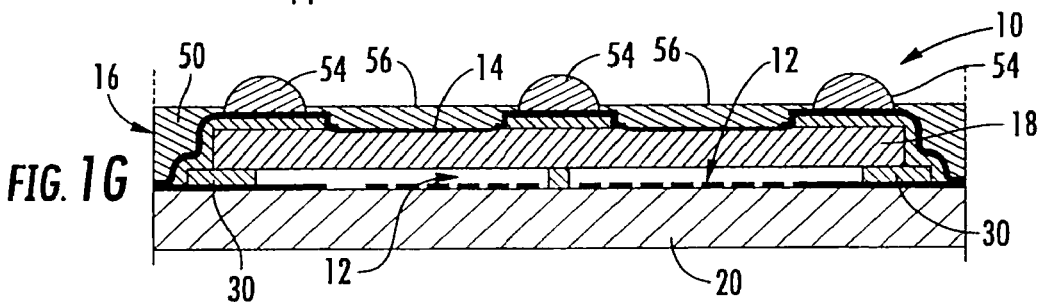

With reference initially to FIGS. 1A-1G, one embodiment of the present invention may include a method of assembly of a SAW or BAW wafer level package 10 for a filter device 12, as illustrated with reference to FIG. 1G, wherein the package includes an integrated capping circuit 14. One embodiment of a WLP filter with increased functionality includes integration of the capping circuit 14 as additional circuitry within a cap structure 16 without sacrificing footprint or height. The disclosure herein presented builds upon the wafer-level packaging described in the U.S. Utility Patent Application having Ser. No. 10/867,172 filed on Jun. 14, 2004 for "Wafer-Level Packaging of Materials with Different Coefficients of Expansion" and issuing as U.S. Pat. No. 7,109,635 the disclosure of which is herein incorporated by reference in it entirety.

A feature of the embodiment herein described, by way of example, may include the circuit 14 constructed on its own substrate 18 prior to bonding to a device wafer 20. With reference to FIG. 1A, this substrate 18 may be of a different material than the device wafer 20. The capping substrate may be removably attached to a surface of the carrier substrate wafer using a temporary bond material such as a photo resist, thermal release tape, UV release material, thermally decomposing material, wax, and the like. The filter device 12 may be formed from a device metallization layer 13. The capping circuit 14 may be patterned and temporarily bonded using a temporary bonding material 22 to a carrier wafer 24 off-line allowing the wafer fabrication processes to be tailored to the circuit substrate 18 itself as compared to forming the circuit 14 on a capped device wafer post-bond. By way of further explanation, creating cap structures that are temporarily bonded to a carrier wafer is described in the above referenced applications and U.S. Pat. No. 7,109,635.

Figure 2:
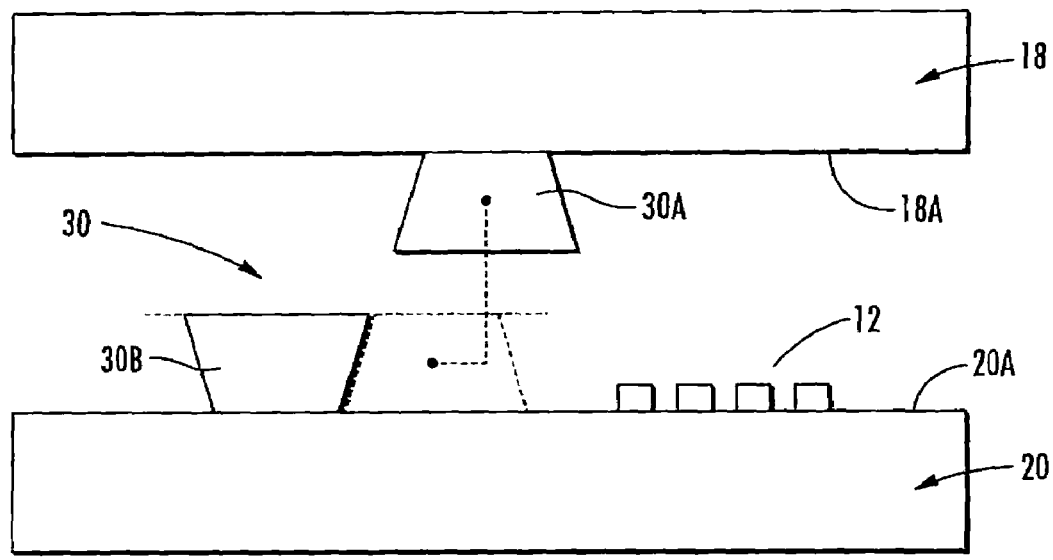
FIG. 2 is a partial elevation view illustrating one interlocking bonding structure in keeping with the teachings of the present invention.

With reference to FIG. 1C, a cavity 26 is created above each active die structure 28 by bonding the carrier wafer 24 that is patterned with the cap structure 16 to the device wafer 20 that is patterned with an adhesive seal 30, herein illustrated by way of example formed as rings. By way of further example, an epoxy polymer like SU8 or solder material may be used as the adhesive seal 30. In one embodiment of the invention, the bonding from the adhesive seal 30 may comprise first and second bond portions 30A and 30B extending from opposing surfaces 18A, 20A of the capped substrate 18 and the device wafer 20 respectively, for providing an interlocking connection, as illustrated by way of example with reference to FIG. 2, and as further detailed in U.S. Pat. No. 7,109,635.

Figure 3A:
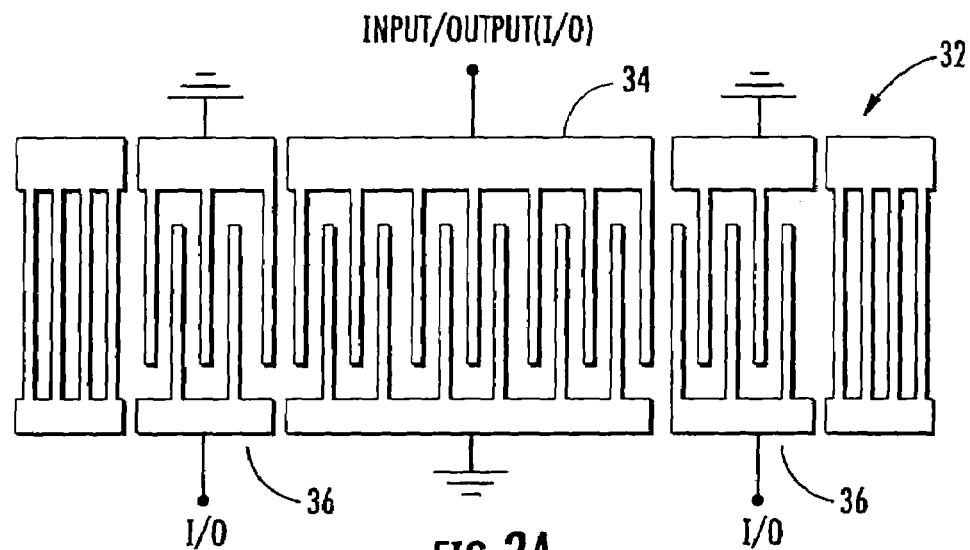
FIGS. 3A and 3B is a partial top plan view illustrating a surface acoustic wave (SAW) coupled resonator structure, and a cross-sectional view respectively.
Figure 3B:
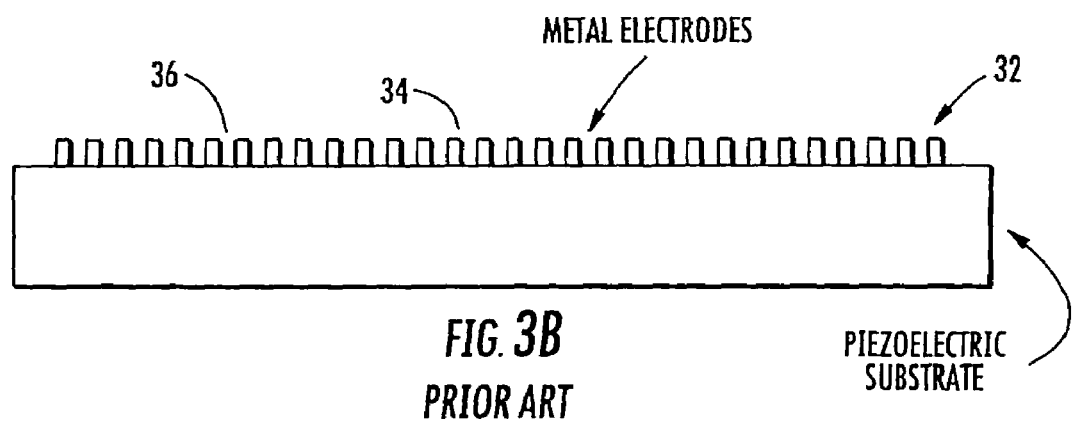
Figure 4:
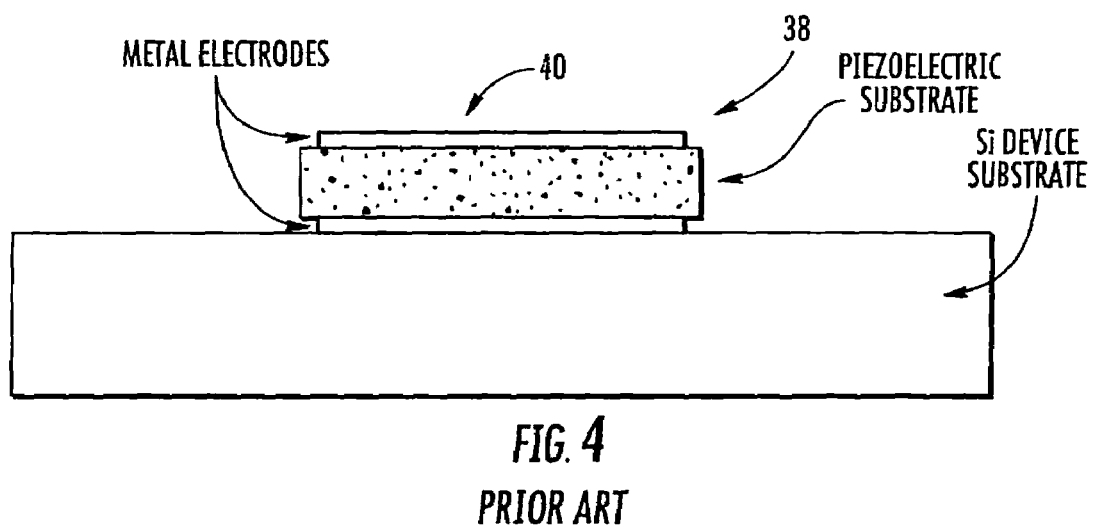
FIG. 4 is a partial elevation view illustrating a bulk acoustic wave (BAW) resonator structure.

By way of example, in one embodiment of a SAW WLP filter, the active die structure may comprise at least one of an acoustic SAW resonator with a connecting pad. The acoustic SAW resonator 32 is typically composed of an interdigital transducer 34 embedded between two reflectors 36 as illustrated with reference to FIGS. 3A and 3B. By way of example, the resonator 32 is fabricated on a device piezoelectric substrate material of lithium tantalate, lithium niobate, and quartz. By way of further example, and as illustrated with reference to FIG. 4, in an embodiment of a BAW WLP filter 38, the acoustic resonator 40 may comprise a piezoelectric substrate sandwiched between two metal electrodes. The piezoelectric substrate material is typically made of AlN or ZnO. The thickness and qualities of the piezoelectric substrate and the metal electrode determine the resonator characteristics. The BAW resonator is typically fabricated on a device wafer comprises Si as a material. The carrier wafer is re-usable and is the same material as the device wafer to prevent thermal mismatch during the elevated temperatures of the wafer bond process. For example, silicon carrier wafers are used for BAW applications and lithium tantalate carrier wafers are used for SAW applications.

After the carrier wafer 24 is aligned and bonded to the device wafer 20, the temporary bond material 22 is activated and the bonded structures 18, 20 are released from the carrier wafer, as illustrated with reference again to FIG. 1C. As herein presented by way of example, the cap structure 16 includes the circuit 14 and the entire structure is transferred to the device wafer 20 to form the cavities 26 over the active filter areas 28 of the device wafer. Since the capping circuit 14 is thermally decoupled from the device wafer 20 via the carrier wafer WLP method as herein described, almost any type of capping circuit substrate material (silicon, dielectric, GaAs, etc.) can be bonded to the device wafer without generating significant thermal stress. This allows for the direct integration of a variety of functional circuitry within the WLP filter device such as impedance matching circuits, ESD protection circuits, pyro-suppression circuits, and the like.

With reference to FIG. 1D, the next step in the WLP integration is to connect input and output contacts (I/O) 42 on the capping circuit 18 to the I/O 44 on the device wafer 20. Applying and defining a first dielectric layer 46 over portions of the top surface 18B and side surfaces 18C of the capping circuit structure 18 accomplishes this. This dielectric layer 46 increases the reliability of the subsequent I/O connections by smoothing out edge features around the capping structure and by improving the adhesion of the metal I/O connections to the capping circuit substrate. This dielectric layer 46 insulates the metal I/O connections from the capping circuit substrate 18 (in the case of semiconductor substrates such as silicon). The first dielectric layer 46 may be an epoxy polymer like SU8 or a photoresist with thickness typically varying from 5 um to 15 um.

With reference now to FIG. 1E, the next step applies and defines a metallization layer 48 for joining the I/O 42 on the capping circuit 18 with the I/O 44 on the device wafer 20 and, depending on the application, redistributes the I/O connection to the top side of the cap structure 16, as may be desired. However, this metallization step is not limited to forming the I/O connections alone. Metallization also can be applied to select regions around the cap structure for the purpose of improving the RF performance of the device as well as improving its moisture resistance.

With reference to FIG. 1F, the next may be employed as desired for a specific use, and applies and defines a second dielectric layer 50 over the capped structure 16. This second dielectric layer 50 protects any exposed capping circuitry 14 and may define solder contact locations 52 for mounting to a customer's circuit board (in the case of solder flip chip attachment). Additionally, the second dielectric layer 50 increases the integrity of the cap structure 16. The cap structure 16 is preferably robust enough to withstand the high pressures (up to 10 Mpascal) and temperatures (typically as high as 270° C.) associated with the molding and assembly of WLP filters into modules. With the application of the second dielectric layer 50, the mechanical robustness of the cap structure 16 may be tailored by simply adjusting the thickness of the $2^{nd}$ dielectric layer. The second dielectric layer 50, for the embodiment herein described by way of example, comprises an epoxy polymer like SU8 with thickness typically varying from 5 um to 10 um.

Optionally, a final step to integrating the WLP filter device 10, as illustrated with reference again to FIG. 1G, may include applying solder bumps 54 to the I/O solder locations 52 on the top side of the cap structure. Various methods exist for applying the solder such as plating, printing, solder ball placement, and the like. The solder bumps may be of a ball-grid-array (BGA) format which is widely adopted by the IC industry for package attachment.

It may be desirable for the integrated WLP 10 to be provided to users in a form that is fully compatible with standard IC assembly technology. It should be noted that the solder bumps 54 can be strategically placed on the top side of the cap to help improve the reliability and manufacturability of the integrated WLP filter device. For instance, bumps can be placed directly over active areas 56 of the capping circuit 14 to aid in heat removal. Bumps also can be placed over unsupported capped regions to act as anchors that help the cap structure 16 resist deflection during overmold.

Many modifications and other embodiments of the invention will come to the mind of one skilled in the art having the benefit of the teachings presented in the foregoing descriptions and the associated drawings and photos. Therefore, it is to be understood that the invention is not to be limited to the specific embodiments disclosed, and that modifications and alternate embodiments are intended to be included within the scope of the claims supported by this specification.

That which is claimed is:

1. A method of assembling a wafer-level package filter, the method comprising:
   providing a capping substrate;
   constructing a capping circuit on the capping substrate;
   providing a carrier wafer and a device wafer having compatible coefficients of thermal expansion such that a thermal mismatch is prevented during elevated temperatures of a wafer bonding process, the device wafer having a device circuit on a surface thereof;
   forming a device metalization layer on the surface of the device wafer, wherein the device metallization layer includes an active die filter area including the device filter;
   applying an adhesive seal on the device metalization layer for placing the active die filter area and thus the filter device within a cavity;
   removably attaching the capping substrate to a surface of the carrier wafer;
   aligning the carrier wafer with the device wafer;
   bonding the carrier wafer to the device wafer by attaching the capping substrate having the capping circuit thereon to the adhesive seal for securing the capping substrate to the device wafer having the device metallization layer thereon;
   releasing the bonded capping substrate and the device wafer from the carrier wafer;
   applying a dielectric layer over the capping substrate while maintaining exposure to the capping circuit; and
   applying an I/O metallization layer for joining an I/O connection of the capping circuit with an I/O connection of the device wafer and thus electrically connecting the capping circuit to the device filter.

2. The method according to claim 1, wherein the dielectric layer applying over the capping substrate comprises applying a first dielectric layer, the method further comprising applying a second dielectric layer over the capping substrate for protecting exposed capping circuitry while defining contacts for electrical connection to a printed circuit board in a solder flip chip attachment.

3. The method according to claim 1, further comprising applying solder bumps to selected I/O connections on the capping substrate.

4. The method according to claim 1, wherein the capping substrate is formed from a material that is different material forming the device wafer.

5. The method according to claim 1, wherein the capping circuit is temporarily bonded to a carrier wafer off-line allowing a wafer fabrication process to be tailored to a circuit substrate.

6. The method according to claim 1, wherein the carrier wafer is re-usable and comprises the same material as the device wafer.

7. The method according to claim 1, wherein the carrier wafer comprises a silicon carrier wafer for BAW applications and a lithium tantalate carrier wafer for SAW applications.

8. The method according to claim 1, wherein the capping circuit comprises at least one of an inductor and capacitor.

9. The method according to claim 1, wherein the capping substrate is selected from a material comprising silicon, dielectric, and GaAs.

10. The method according to claim 1, wherein the removably attaching comprises providing a temporary bond material selected from a group consisting of photo resist, thermal release tape, a UV release material, a thermally decomposing material, and wax.

11. The method according to claim 1, wherein the capping circuit is thermally decoupled from the device wafer via the carrier wafer and thus can be bonded to the device wafer without generating significant thermal stress.

12. The method according to claim 1, wherein the dielectric layer applying increases reliability of the subsequent I/O connections by smoothing out edges around the capping substrate and by improving adhesion of metal I/O connections to the capping substrate.

13. The method according to claim 1, wherein the I/O metallization layer is applied to preselected regions of the capping substrate for improving an RF performance and for improving moisture resistance.

14. The method according to claim 2, wherein the second dielectric layer increases integrity of the capping substrate.

15. The method according to claim 1, wherein the capping substrate is sufficiently robust to withstand high pressures and temperatures typically associated with molding of wafer level package filters into modules.

16. The method according to claim 2, wherein an amount of the second dielectric layer applying permits a mechanical robustness of the cap structure to be tailored by adjusting a thickness thereof.

17. The method according to claim 1, wherein applying an I/O metallization layer comprises at least one of applying a solder bump selected from methods comprising plating, printing, and solder ball placement.

18. The method according to claim 17, wherein the solder bumps form a ball-grid-array (BGA) format for a package attachment.

19. The method according to claim 17, wherein the solder bumps are placed directly over the active device areas of the capping circuit to aid in heat removal.

20. The method according to claim 17, wherein the solder bumps are placed over unsupported capped regions to act as anchors that help the capping substrate resist deflection.

21. A method of assembling a wafer-level package filter, the method comprising:
constructing a capping circuit on a capping substrate;
providing a carrier wafer and a device wafer having compatible coefficients of thermal expansion;
forming a device metalization layer on a surface of the device wafer, wherein the device metalization includes an active die filter area;
placing the active die filter area within a cavity;
attaching the capping substrate to a surface of the carrier substrate;
aligning the carrier wafer with the device wafer;
bonding the carrier wafer to the device wafer;
releasing the capping substrate and device wafer from the carrier wafer;
applying a dielectric layer over the capping substrate; and
electronically connecting the capping circuit to the device circuit.

22. The method according to claim 21, wherein the applying a dielectric layer over the capping substrate comprises applying a first dielectric layer, the method further comprising applying a second dielectric layer over the capping substrate.

23. The method according to claim 21, further comprising providing a material for the capping substrate that is different from the device wafer.

24. The method according to claim 21, wherein constructing the capping circuit comprises temporarily bonding the capping circuit to the carrier wafer and placing the capping circuit on the capping substrate after the bonding step.

25. The method according to claim 21, wherein providing the carrier wafer comprises providing a silicon carrier wafer for BAW applications and a lithium tantalate carrier wafer for SAW applications.

26. The method according to claim 21, wherein the capping substrate attaching comprises providing a temporary bond material selected from a group consisting of photo resist, thermal release tape, a UV release material, a thermally decomposing material, and wax.

27. The method according to claim 21, wherein the capping circuit is thermally decoupled from the device wafer via the carrier wafer and thus can be bonded to the device wafer without generating significant thermal stress.

28. The method according to claim 21, further comprising placing solder bumps directly over active device areas of the capping circuit to aid in heat removal.

29. The method according to claim 21, wherein the applying a dielectric layer over the capping substrate results in unsupported capped regions, the method further comprising placing solder bumps over the unsupported capped regions for anchoring the capping substrate and resisting deflection.

* * * * *